(12) United States Patent
Kwon et al.

(10) Patent No.: US 11,061,439 B2
(45) Date of Patent: Jul. 13, 2021

(54) FOLDING DEVICE DISPLAY

(71) Applicant: SAMSUNG DISPLAY CO., LTD., Yongin-si (KR)

(72) Inventors: Eui Jung Kwon, Cheonan-si (KR); Hee Kwon Lee, Asan-si (KR); Kyu Bong Jung, Asan-si (KR); Soong Won Cho, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/854,157

(22) Filed: Apr. 21, 2020

(65) Prior Publication Data

US 2021/0064092 A1 Mar. 4, 2021

(30) Foreign Application Priority Data

Sep. 2, 2019 (KR) .................. 10-2019-0108288

(51) Int. Cl.
| | |
|---|---|
| *G06F 1/16* | (2006.01) |
| *G09F 9/30* | (2006.01) |
| *G06F 1/18* | (2006.01) |
| *H01L 51/00* | (2006.01) |

(52) U.S. Cl.
CPC ............ *G06F 1/1652* (2013.01); *G06F 1/189* (2013.01); *G09F 9/301* (2013.01); *H01L 51/0097* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,091,665 | B2* | 8/2006 | Nomoto ................ | H05K 5/02 313/567 |
| 7,230,659 | B2* | 6/2007 | Ha ..................... | G02F 1/133308 349/58 |
| 9,291,853 | B2* | 3/2016 | Maruno ............... | G02B 6/0088 |
| 10,719,160 | B2* | 7/2020 | Lee ..................... | G06F 3/0414 |
| 2006/0176417 | A1 | 8/2006 | Wu et al. | |
| 2008/0079861 | A1* | 4/2008 | Seo .................... | G06F 1/1601 349/58 |
| 2011/0162878 | A1 | 7/2011 | Shu et al. | |
| 2014/0218656 | A1* | 8/2014 | Maruno ............. | G02F 1/133608 349/60 |
| 2015/0370133 | A1 | 12/2015 | Kim et al. | |

(Continued)

FOREIGN PATENT DOCUMENTS

| | | |
|---|---|---|
| CN | 1598658 | 3/2005 |
| EP | 2 730 968 | 5/2014 |
| EP | 2793263 | 10/2014 |

(Continued)

OTHER PUBLICATIONS

Extended European Search Report dated Apr. 22, 2021 for European Application No. 20185404.9.

*Primary Examiner* — Lisa Lea-Edmonds
(74) *Attorney, Agent, or Firm* — F. Chau & Associates, LLC

(57) ABSTRACT

A display device includes a display panel, a mold frame at least partially surrounding the display panel, and a bracket at least partially overlapping the mold frame. Each of the mold frame and the bracket includes an electrically conductive material, and the mold frame and the bracket are electrically connected to each other.

21 Claims, 16 Drawing Sheets

(56) References Cited

U.S. PATENT DOCUMENTS

2018/0157089 A1    6/2018  Morii et al.

FOREIGN PATENT DOCUMENTS

| | | |
|---|---|---|
| EP | 3 185 067 | 6/2017 |
| JP | 2005077590 | 3/2005 |
| JP | IP 2005077590 | 3/2005 |
| JP | 2012226668 | 11/2012 |
| KR | 20100035967 | 4/2010 |
| KR | 2012226688 | 11/2012 |
| KR | 2014-0072424 | 6/2014 |
| KR | 2793283 | 10/2014 |
| KR | 20150027498 | 2/2015 |
| KR | 2160042730 | 4/2016 |
| KR | 20160042730 | 4/2016 |
| LR | 20150027498 | 3/2015 |

* cited by examiner

FOLDING DEVICE DISPLAY

CROSS-REFERENCE TO RELATED APPLICATION

This application claims priority to Korean Patent Application No. 10-2019-0108288, filed on Sep. 2, 2019 in the Korean Intellectual Property Office, and all the benefits accruing therefrom under 35 U.S.C. 119, the disclosure of which is herein incorporated by reference in its entirety.

TECHNICAL FIELD

The present disclosure relates to a display device, and more particularly, to a display device capable of switching a state between a folded state and an unfolded state.

DISCUSSION OF THE RELATED ART

A display device is a device for displaying an image. A display device generally includes a display panel, such as an organic light emitting diode (OLED) display panel or a liquid crystal display (LCD) panel.

Often mobile electronic devices include a display device so as to provide an image to a user thereof. Even as mobile electronic devices having gained larger display screens, the mobile electronic devices have tended to have the same or a smaller volume or thickness. Some mobile electronic devices are now being made to be foldable or bendable. These devices may include a displays that are foldable or bendable. By having such a display, these mobile electronic devices can achieve a larger screen when folded open and a smaller form factor when folded closed.

SUMMARY

A display device includes a display panel. A mold frame is disposed around the display panel. A bracket is disposed to at least partially overlap the mold frame. Each of the mold frame and the bracket includes an electrically conductive material, and the mold frame and the bracket are electrically connected to each other.

The display device may further include a protective film disposed on the display panel. The display panel may include a cover region at least partially overlapping the protective film and an exposed region exposed by the protective film.

The protective film may include a protective base, and a protective base bonding layer disposed between the protective base and the display panel.

The display device may further include a connection conductor disposed between the bracket and the mold frame. The mold frame and the bracket may be directly connected to the connection conductor.

The connection conductor may include an electrically conductive base, a first conductive bonding layer disposed between the conductive base and the mold frame, and a second conductive bonding layer disposed between the bracket and the conductive base.

The connection conductor may include a clamp.

The mold frame may include a main frame portion and a frame conductive layer disposed directly on a surface of the main frame portion. The conductive layer may be electrically connected to the bracket.

The conductive layer is formed on the main frame portion by coating, deposition, or thermal attachment.

The bracket may be made of an electrically conductive material.

The bracket may include a main bracket portion and a bracket conductive layer disposed inside the main bracket portion. The connection conductor may be connected to the frame conductive layer and the bracket conductive layer.

The main bracket portion may be further disposed on a lower surface of the display panel.

The main frame portion may include a first frame portion disposed on a side surface of the display panel, and a second frame portion connected to the first frame portion and at least partially overlapping one surface of the display panel.

The conductive layer may be disposed directly on the first frame portion.

The conductive layer may further include a plurality of conductive patterns, each of which being spaced apart from each other along the second frame portion.

The mold frame may include an electrically conductive material dispersed therein.

The bracket may be connected to a set ground wire.

The display device may further include a cover window disposed between the protective film and the display panel, and a light blocking pattern disposed directly on an edge of the cover window along the edge of the cover window. The light blocking pattern may include an electrically conductive material.

According to an exemplary embodiment of the present disclosure, a display device includes a display panel in which a folding region, a first non-folding region located on one side of the folding region, and a second non-folding region located on the other side of the folding region are defined. A first mold frame is disposed adjacent to the first non-folding region of the display panel. A second mold frame is disposed adjacent to the second non-folding region of the display panel. A first bracket at least partially overlaps the first mold frame. A second bracket at least partially overlaps the second mold frame. Each of the first mold frame and the second mold frame includes an electrically conductive material. Each of the first bracket and the second bracket includes an electrically conductive material. The first mold frame and the first bracket are electrically connected to each other. The second mold frame and the second bracket are electrically connected to each other.

The display device may further include a protective film disposed on the display panel. The display panel may include a cover region at least partially overlapping the protective film and an exposed region exposed by the protective film.

The display device may further include a first connection conductor disposed between the first bracket and the first mold frame, and a second connection conductor disposed between the second bracket and the second mold frame. The first mold frame and the first bracket may be directly connected to the first connection conductor. The second mold frame and the second bracket may be directly connected to the second connection conductor.

Each of the first bracket and the second bracket may be connected to a set ground wire.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
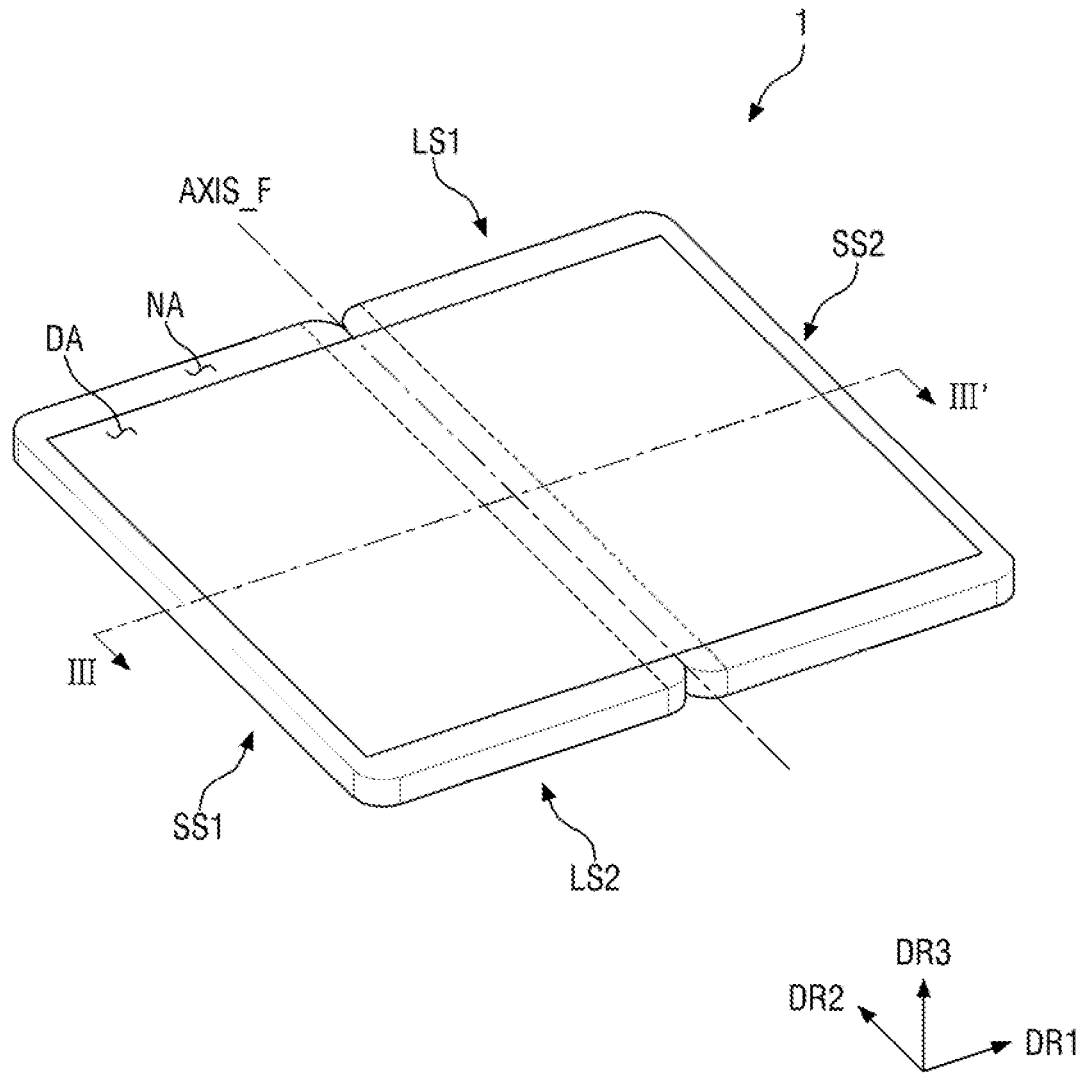
FIG. 1 is a perspective view illustrating a display device according to an exemplary embodiment of the present disclosure.

Specific structural and functional descriptions of embodiments of the invention disclosed herein are provided for illustrative purposes so as to show exemplary embodiments of the present disclosure. The invention may be embodied in many different forms without departing from the spirit and significant characteristics of the present disclosure. Therefore, the illustrated exemplary embodiments of the present disclosure and the invention is not necessarily limited to the embodiments shown herein.

It will be understood that when an element is referred to as being related to another element such as being "coupled" or "connected" to another element, it can be directly coupled or connected to the other element or intervening elements may be present therebetween.

Throughout the specification and drawings, the same reference numerals may refer to the same or like parts.

It will be understood that, although the terms "first," "second," "third" etc. may be used herein to describe various elements, components, regions, layers and/or sections, these elements, components, regions, layers and/or sections should not necessarily be limited by these terms. These terms are used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not necessarily intended to be limiting to the invention as a whole. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. As used herein, the term "consisting of" does preclude the presence or addition of other elements not recited.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" can mean within one or more standard deviations, or within ±30%, 20%, 10% or 5% of the stated value.

Exemplary embodiments of the present disclosure are described herein with reference to cross section illustrations that may be schematic illustrations of idealized embodiments. As such, variations from the shapes of the illustrations as a result, for example, of manufacturing techniques and/or tolerances, may be expected. Thus, embodiments described herein should not necessarily be construed as limited to the particular shapes of regions as illustrated herein but are to include deviations in shapes that result, for example, from manufacturing. For example, a region illustrated or described as flat may have rough and/or nonlinear features. Moreover, sharp angles that are illustrated may be at least partially rounded. Thus, the regions illustrated in the figures are schematic in nature and their shapes do not necessarily illustrate the precise shape of a region.

Hereinafter, exemplary embodiments of the present disclosure will be described with reference to the attached drawings. FIG. 1 is a perspective view illustrating a display device according to an exemplary embodiment of the present disclosure.

Referring to FIG. 1, a display device 1 may be a foldable display device. The term "foldable" as used herein may refer to an element that may be flexible, which is to say the element may be partially or fully folded and unfolded, repeatedly without sustaining damage. As used herein, "foldable" may specifically include bendable, rollable and the like. Further, the term "foldable" should be interpreted as including "partially foldable," "entirely foldable," "in-foldable" (e.g. able to be folded inwardly) and "out-foldable" (e.g. able to be folded outwardly).

The display device 1 may have a folding axis AXIS_F crossing the upper and lower sides of the display device in plan view. The display device 1 may be folded about the folding axis AXIS_F.

The display device 1 may have a substantially rectangular shape in plan view. The display device may have a rectangular shape with right-angled or rounded corners in plan view.

The display device may include four sides LS1, LS2, SS1 and SS2. The display device may include two long sides LS1 and LS2 and two short sides SS1 and SS2. For example, each of the long sides LS1 and LS2 may extend in a first direction DR1, and each of the short sides SS1 and SS2 may extend in a second direction DR2 that may be perpendicular to the first direction.

As illustrated in FIG. 1, the folding axis AXIS_F may extend in a direction (e.g., a second direction DR2) crossing the long sides LS1 and LS2. In this case, each of the long sides LS1 and LS2 of the display device 1 may be folded substantially in half. Unlike the illustrated example, the folding axis AXIS_F may extend across each of the short sides SS1 and SS2. In this case, each of the short sides SS1 and SS2 of the display device 1 may be folded substantially in half. Hereinafter, for simplicity of description, a case where the folding axis AXIS_F extends across each of the long sides LS1 and LS2 will be mainly described. The folding axis AXIS_F may cross a central portion of each of the long sides LS1 and LS2, but the present invention is not necessarily limited thereto and the folding axis AXIS_F may extend in an upper portion or a lower portion of the long sides LS1 and LS2.

Meanwhile, unless otherwise defined herein, with respect to a thickness direction, the terms "upper" and "upper surface" refer to a display direction (e.g. a direction in which an image projects from the display device 1 while in an unfolded state, and "lower" and "lower surface" refer to a direction opposite to the display direction. In addition, "up," "down," "left," and "right" in plan view refer to a direction when viewed from above with the display surface in place.

The display device 1 may include a display area DA and a non-display area NA disposed at least partially around the display area DA. The display area DA is an area where an image is displayed (e.g. where pixels are disposed), and the non-display area NA is an area where an image is not displayed (e.g. where no pixels are disposed). The display area DA may be located at the center of the display device 1. In a folded state of the display device 1, regions of the display area DA divided by the folding axis AXIS_F may at least partially overlap each other. Thus, the display device 1 may be folded in onto itself in the folded state. In an unfolded state, an image may be displayed in the display area DA with the respective regions unfolded. Although not shown, the non-display area NA may further include a pad area connected to a printed circuit board. A plurality of pads may be disposed in the pad area to be electrically connected to lead wires of the printed circuit board.

Grooves (e.g., notches) recessed downwardly or upwardly in plan view may be formed in regions adjacent to the first long side LS1 and the second long side LS2 of the display device 1 that meet the folding axis AXIS_F, respectively. The recessed groove may be coupled to a hinge member for switching between the folded state and the unfolded state, but the present invention is not limited thereto.

The display device 1 may be divided into a folding region FR and non-folding regions NFR1 and NFR2 with respect to the folding axis AXIS_F.

For example, the display device 1 may include the folding region FR (see FIG. 3) disposed in the central area and including the folding axis AXIS_F, and the non-folding regions NFR1 and NFR2 (see FIG. 3) spaced apart from each other with the folding region FR interposed therebetween. The first non-folding region NFR1 may be located on one side of the folding region FR in the first direction DR1, and the second non-folding region NFR2 may be located on the other side of the folding area FR in the first direction DR1.

The folding region FR may be a region within which the display device 1 is folded or bent with a predetermined curvature in a folding direction, and the non-folding regions NFR1 and NFR2 may be regions that are not folded. The non-folding regions NFR1 and NFR2 may be located on flat surfaces, respectively, forming the same plane. However, the present invention is not limited thereto and the non-folding regions NFR1 and NFR2 may be at least partially bent.

Hereinafter, an operation of the display device 1 according to an exemplary embodiment of the present disclosure will be described in detail.

Figure 2:
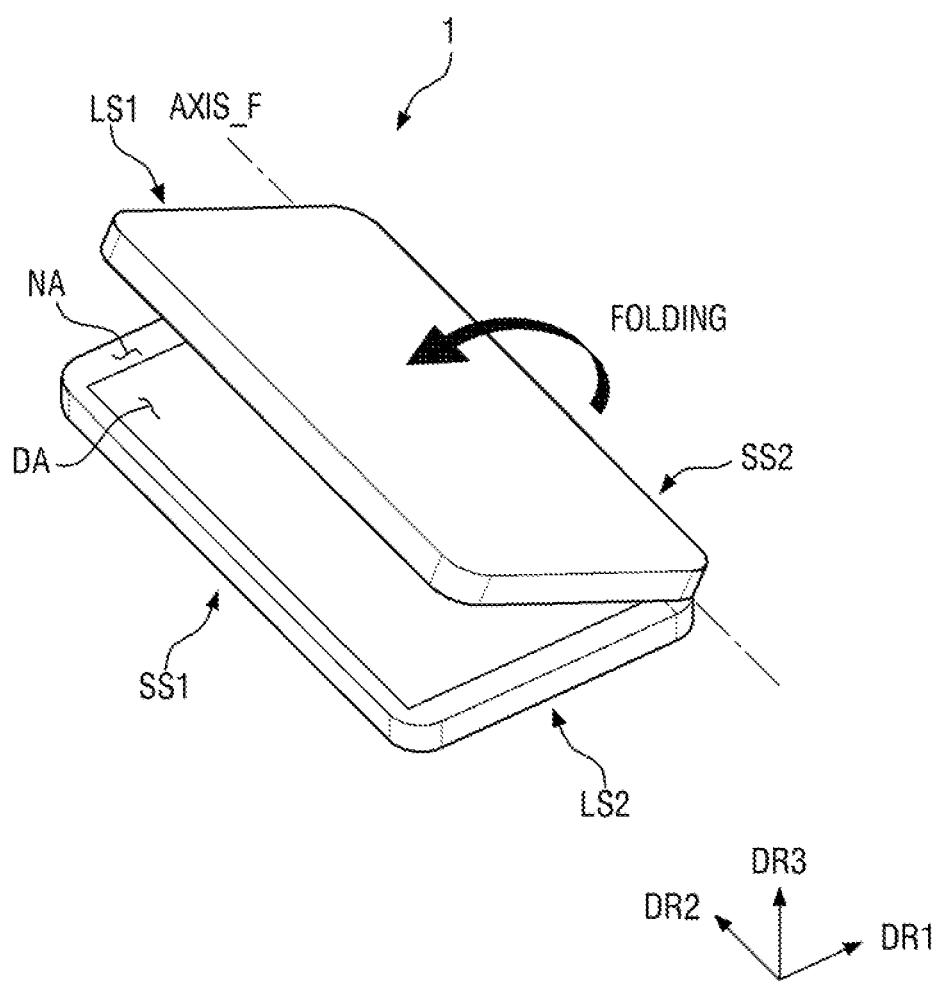
FIG. 2 is a perspective view illustrating a folded state of a display device according to an exemplary embodiment of the present disclosure.

FIG. 2 is a perspective view illustrating a folded state of a display device according to an exemplary embodiment of the present disclosure.

Referring to FIG. 2, the display device 1 may be folded with a predetermined curvature in the folding region FR, but may remain substantially unfolded in the non-folding regions NFR1 and NFR2. For example, the display device 1 may have flat surfaces forming the same plane in the non-folding regions NFR1 and NFR2, respectively. The display device 1 may be folded by an external force, for example, by the hands of a user.

When an external force is applied to one side (e.g., a right side) of the display device 1, in the folding direction (upper direction in FIG. 2, third direction DR3), the folding region FR may be bent or folded, and the second non-folding region NFR2 may overlap or oppose the first non-folding region NFR1 while moving or rotating along the folding direction.

In FIG. 2, the display device 1, according to an exemplary embodiment of the present disclosure is illustrated as being in-folded (e.g. folded inwardly). In-folding of the display device 1 may mean that the display device 1 is folded such that the top surfaces (or display surfaces) of the display device 1 face each other. By in-folding the display device 1, display area DA thereof may be protected while not in use.

In some exemplary embodiments of the present disclosure, the display device 1 may be out-folded (e.g. folded outwardly). Out-folding of the display device 1 may mean that the display device 1 is folded such that the top surfaces (or display surfaces) of the display device 1 face in opposite directions. By out-folding the display device 1, display area DA thereof may remain at least partially visible while not in use.

Figure 3:
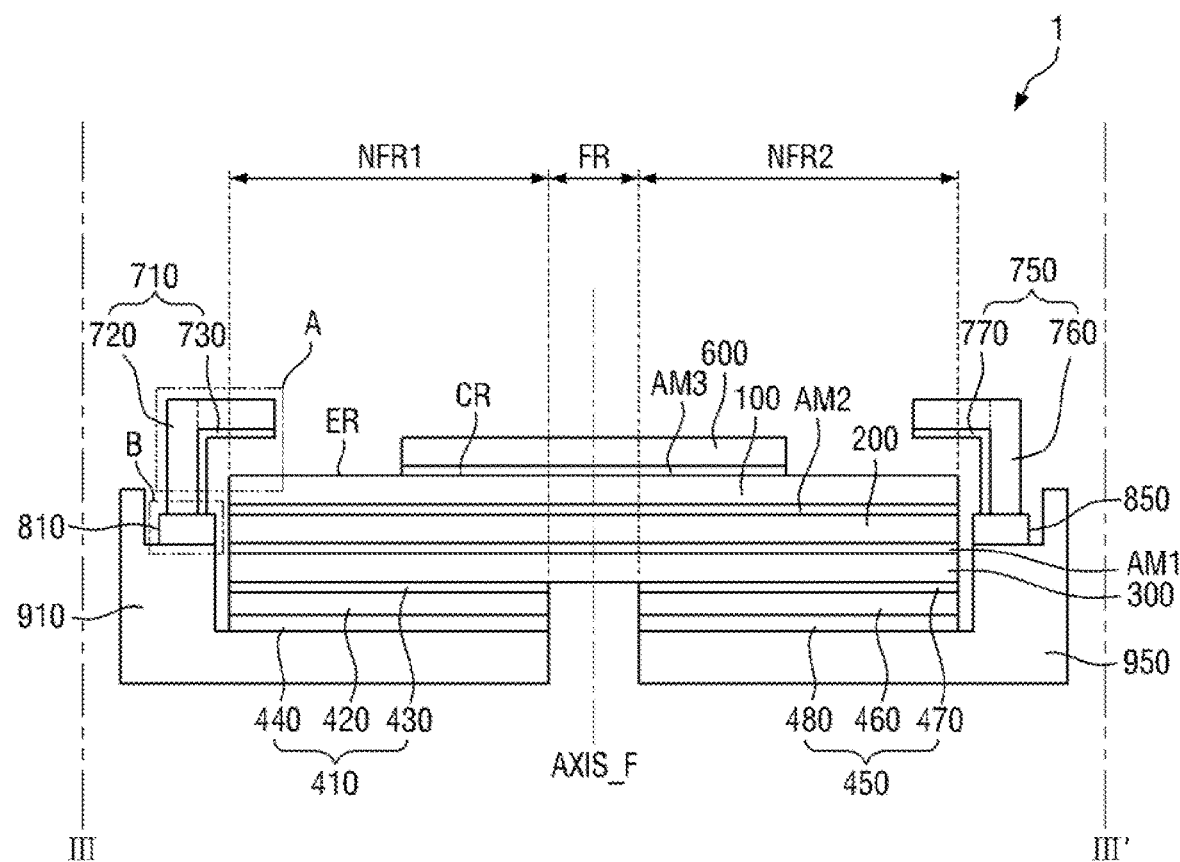
FIG. 3 is a cross-sectional view taken along line III-III' of FIG. 1.
Figure 4:
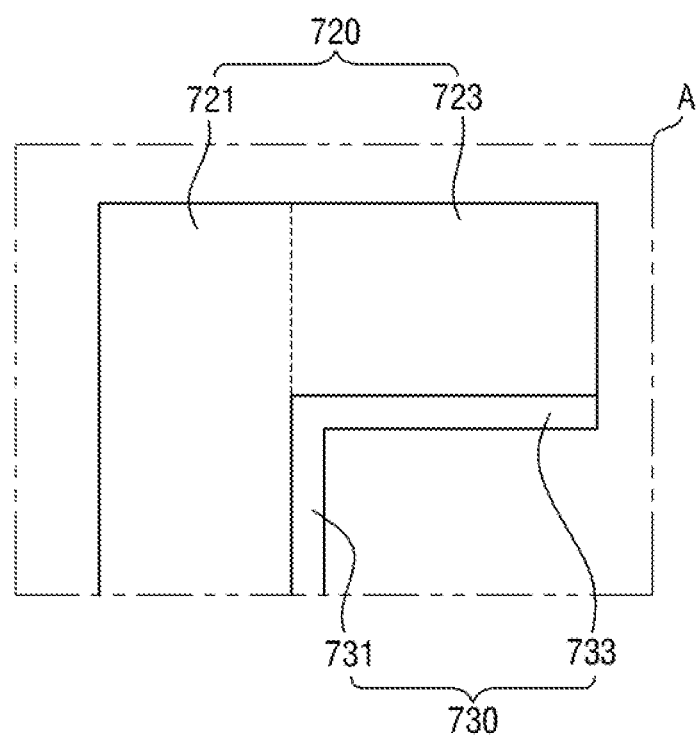
FIG. 4 is an enlarged cross-sectional view of region A of FIG. 3.
Figure 5:
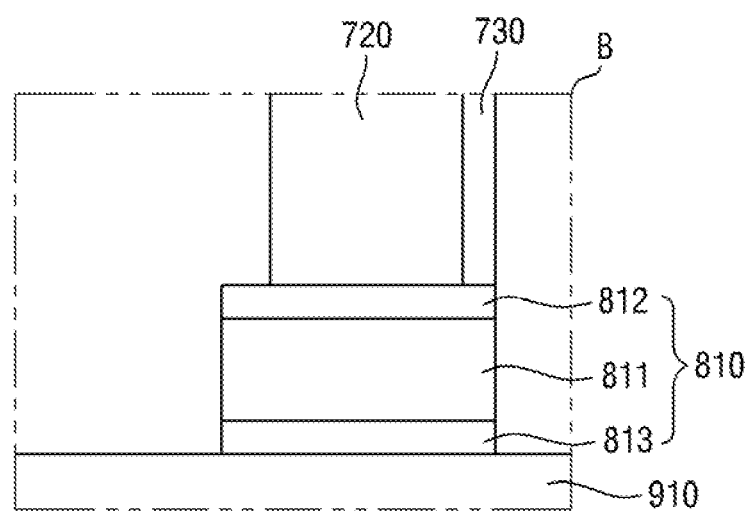
FIG. 5 is an enlarged cross-sectional view of region B of FIG. 3.
Figure 6:
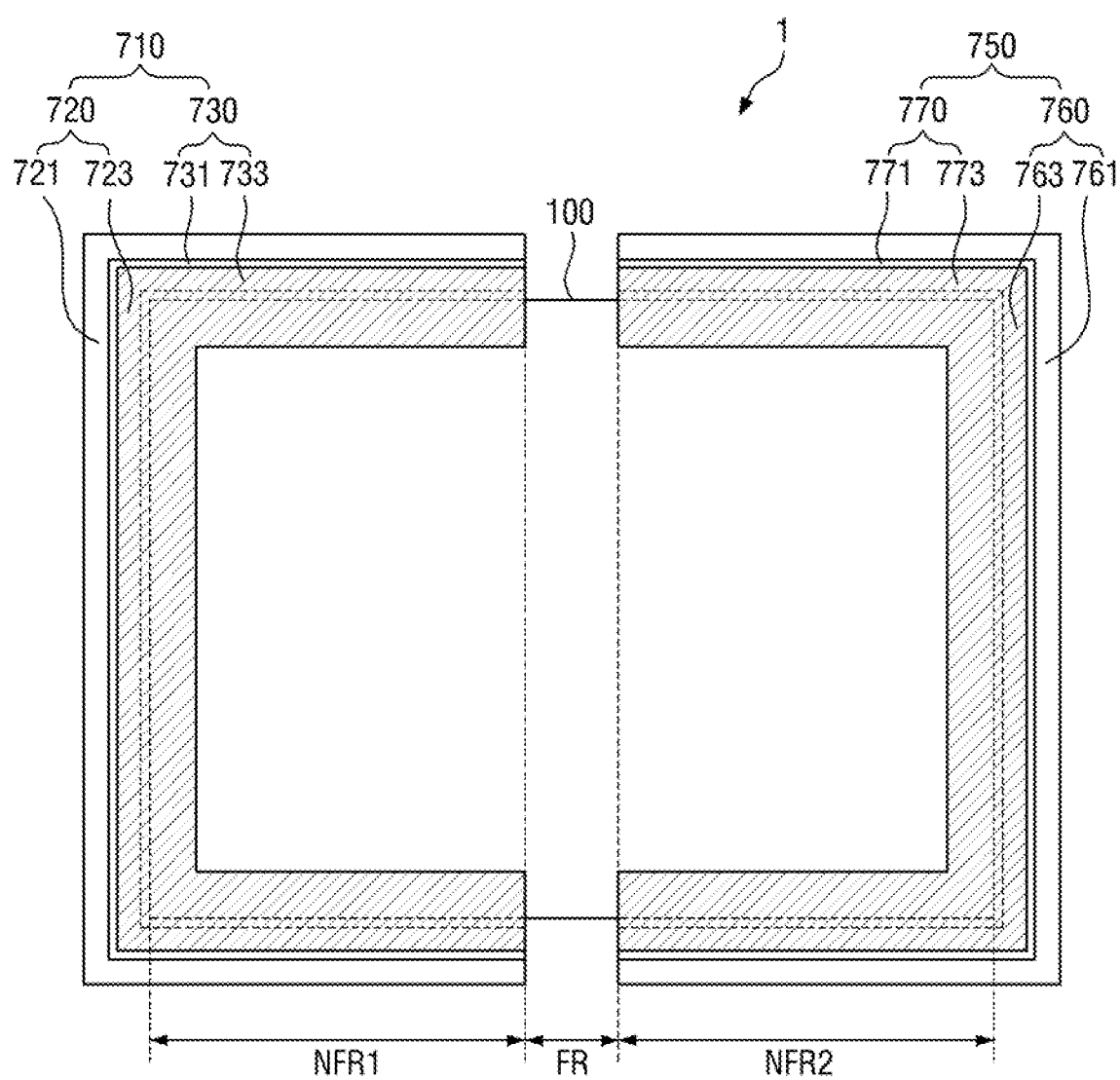
FIG. 6 is a plan layout view illustrating a display panel, a first mold frame and a second mold frame according to an exemplary embodiment of the present disclosure.
Figure 7:
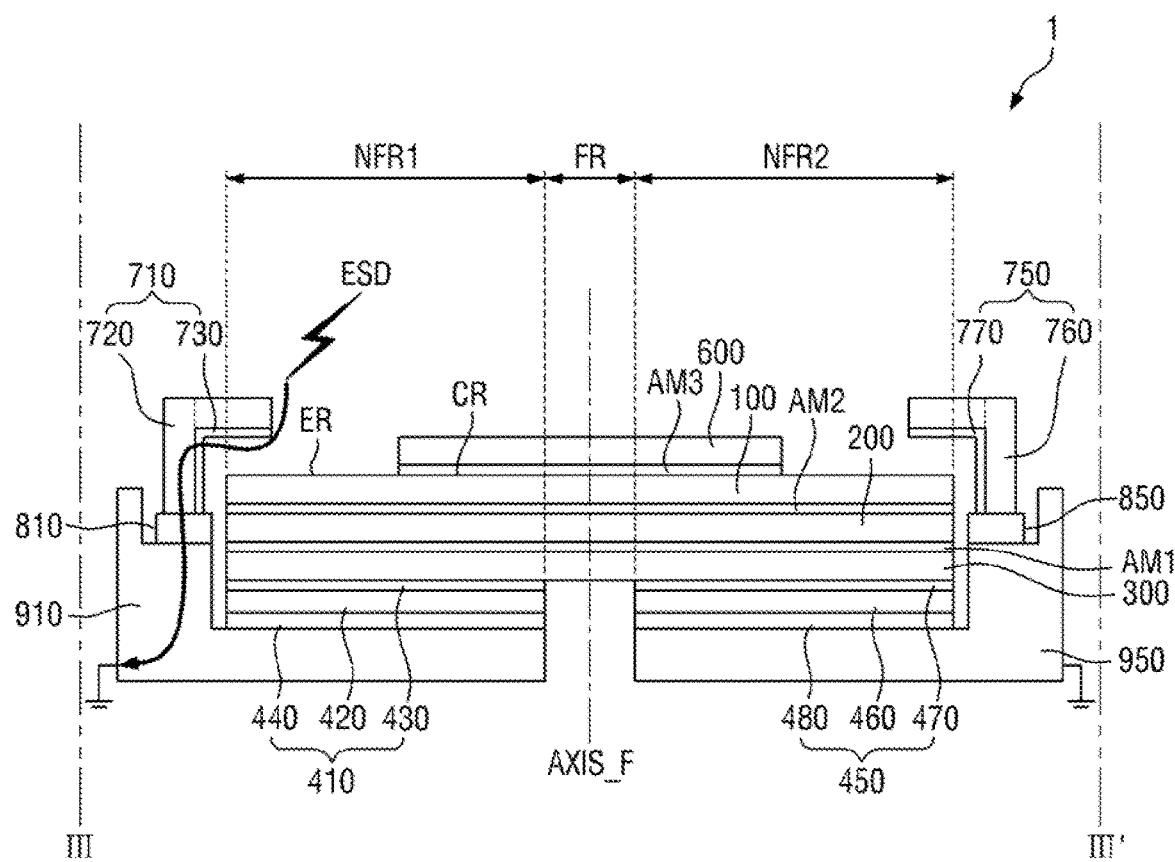
FIG. 7 is a cross-sectional view illustrating a discharge path of static electricity applied to a display device according to an exemplary embodiment of the present disclosure.

FIG. 3 is a cross-sectional view taken along line I-III' of FIG. 1. FIG. 4 is an enlarged cross-sectional view of region A of FIG. 3. FIG. 5 is an enlarged cross-sectional view of region B of FIG. 3. FIG. 6 is a plan layout view illustrating a display panel, a first mold frame and a second mold frame according to an exemplary embodiment of the present disclosure. FIG. 7 is a cross-sectional view illustrating a discharge path of static electricity applied to a display device according to an exemplary embodiment of the present disclosure.

Referring to FIGS. 3 to 7, the display device 1, according to an exemplary embodiment of the present disclosure, may include a display panel 100, a buffer member 200 disposed below the display panel 100, a metal plate 300 disposed below the buffer member 200, double-sided tapes (tape having an adhesive surface on both sides thereof) 410 and 450 disposed below the metal plate 300, a protective layer 600 disposed above the display panel 100, mold frames 710 and 750 disposed around the display panel 100, brackets 910 and 950 disposed to at least partially overlap the mold frames 710 and 750, and connection conductors 810 and 850 disposed between the mold frames 710 and 750 and the brackets 910 and 950, respectively.

Further, the display device 1, according to the exemplary embodiment of the present disclosure, may include a first coupling member AM1 disposed between the buffer member 200 and the metal plate 300, a second coupling member AM2 disposed between the buffer member 200 and the display panel 100, and a third coupling member AM3 disposed between the display panel 100 and the protective layer 600.

The display panel 100 may display an image according to an input data signal. The display panel 100 may be an organic light emitting diode (OLED) display panel, a liquid crystal display (LCD) panel, a plasma display panel, an electrophoretic display panel, an electrowetting display panel, a quantum dot light emitting display panel, a micro light emitting diode (LED) display panel, or the like. In the illustrated embodiment, an organic light emitting display panel is used as the display panel 100.

The display panel 100 may include a flexible substrate including a flexible polymer material such as polyimide (PI). Accordingly, the display panel 100 may be bent, folded, or rolled repeatedly without sustaining damage thereto. The display panel 100 may have a shape substantially similar to the planar shape of the display device 1.

A plurality of pixels PX may be disposed exclusively within the display area DA of the display panel 100, and signal lines or driving circuits for applying signals to the pixels PX may be disposed in the non-display area NA. In addition, a black matrix having a planar rectangular frame shape may be disposed in the non-display area NA.

The pixel PX may include a light emitting layer and a circuit layer for controlling the amount of light emitted from the light emitting layer. The circuit layer may include a plurality of wirings, a plurality of electrodes and at least one transistor. The light emitting layer may include an organic light emitting material in one embodiment. The light emitting layer may be encapsulated by an encapsulation layer. The encapsulation layer may encapsulate the light emitting layer to prevent moisture, oxygen, and the like from infiltrating from the outside. The encapsulation layer may be a single or multilayer inorganic film, or a laminated film formed by alternately stacking inorganic and organic films.

In the display panel 100, the folding region FR and the non-folding regions NFR1 and NFR2 may be defined.

The buffer member 200 may be disposed below the display panel 100. The buffer member 200 may prevent an external impact (e.g., from below the buffer member 200) from being transmitted to the display panel 100. The buffer member 200 may be formed of a foam material and may include polyurethane (PU), thermoplastic polyurethane (TPU), silicon (Si), polydimethylacrylamide (PDMA) or the like.

The buffer member 200 may be disposed over the folding region FR and the non-folding regions NFR1 and NFR2.

A support layer may be further disposed between the buffer member 200 and the display panel 100. The support layer may be disposed over the folding region FR and the non-folding regions NFR1 and NFR2 of the display device 1. The support layer may include, for example, a polymer organic insulating material such as polyimide (PI). Coupling members and the support layer respectively disposed on the surface of the support layer facing the display panel 100 and the surface of the support layer facing the metal plate 300 may constitute a support film.

The support film may be disposed below the display panel 100 to support the display panel 100.

The metal plate 300 may be disposed below the buffer member 200. The metal plate 300 may be disposed over the folding region FR and the non-folding regions NFR1 and NFR2. The metal plate 300 may include a metal. Examples of the metal include copper (Cu), aluminum (Al), and the like, but are not necessarily limited thereto.

In some exemplary embodiments of the present disclosure, the metal plate 300 may be divided with the folding region FR therebetween. For example, the metal plate 300 may include a first portion disposed in the first non-folding region NFR1 and a second portion disposed in the second non-folding region NFR2. The first portion and the second portion may be spaced apart from each other with the folding area FR disposed therebetween. In this case, the inner surface of the first portion may be aligned with the boundary of the folding region FR and the first non-folding region NFR1, and the inner surface of the second portion may be aligned with the boundary of the folding region FR and the second non-folding region NFR2.

However, the present invention is not necessarily limited thereto. The inner surface of the first portion may be located outside the boundary between the folding region FR and the first non-folding region NFR1, and the inner surface of the second portion may be located outside the boundary between the folding region FR and the second non-folding region NFR2.

The first coupling member AM1 may be disposed between the buffer member 200 and the metal plate 300 to couple the buffer member 200 with the metal plate 300. The second coupling member AM2 may be disposed between the buffer member 200 and the display panel 100 to couple the buffer member 200 with the display panel 100. The third coupling member AM3 may be disposed between the display panel 100 and the protective layer 600 to couple the display panel 100 with the protective layer 600.

Each of the coupling members AM1 to AM3 may be a film having adhesive properties on both the upper and lower surfaces thereof, for example, pressure sensitive adhesive (PSA), optical clear adhesive (OCA) or optical clear resin (OCR). The adhesive film may include acrylic resin or silicone-based resin. In addition, the adhesive film may have an elongation of 100% to 1,000% V.

The first coupling member AM1 and the second coupling member AM2 disposed below the display panel 100 may have different characteristics from those of the third coupling member AM3 disposed above the display panel 100. For example, when the display device 1 is a top emission type display device, the light transmittance (for visible light) of the third coupling member AM3 may be greater than the light transmittance (for visible light) of the first and second coupling members AM1 and AM2, but the present invention is not necessarily limited thereto.

The double-sided tapes 410 and 450 may be disposed on the lower portion of the metal plate 300. A first double-sided tape 410 may be disposed in the first non-folding region NFR1, and a second double-sided tape 450 may be disposed in the second non-folding region NFR2.

The first double-sided tape 410 may include a first base material 420, a first bonding layer 430 disposed between the first base material 420 and the metal plate 300, and a second bonding layer 440 disposed between the first base material 420 and a first bracket 910. The second double-sided tape 450 may include a first base material 460, a first bonding layer 470 disposed between the first base material 460 and the metal plate 300, and a second bonding layer 480 disposed between the first base material 460 and the first bracket 910 to be described later.

The first double-sided tape 410 and the second double-sided tape 450 may be spaced apart from each other with the folding region FR disposed therebetween.

The side surfaces of the display panel 100, the buffer member 200 and the metal plate 300 may be aligned in the thickness direction. The display panel 100, the buffer member 200 and the metal plate 300 may have substantially the same planar size.

The protective layer 600 may be disposed on the display panel 100 to protect components disposed below the protective layer 600 from an external impact.

Further, the protective layer 600 may perform a short wavelength optical filter function that blocks short wavelength light. As used herein, short wavelength light may include light having a wavelength within a range of about 10 nm to about 400 nm, inclusive. The protective layer 600 may serve to prevent short-wavelength light of the light provided from the display panel 100 from being transmitted to the outside. For example, the protective layer 600 may further include a material that performs the short wavelength optical filter function. The material that performs the short wavelength optical filter function may absorb the short-wavelength light.

The planar size of the protective layer 600 may be smaller than the planar size of the display panel 100. The side surfaces of the protective layer 600 may be located more inwardly than the side surfaces of the display panel 100, respectively. The upper surface of the display panel 100 may include a cover region CR covered by the protective layer 600 and an exposed region ER exposed by the protective layer 600. For example, the cover region CR may be located in a central portion of the display panel 100, and the exposed region ER may be located in a peripheral portion of the central portion of the display panel 100.

The protective layer 600 may include an organic insulating material. Examples of the organic insulating material may include polyethylene terephthalate (PET), polyimide (PI), and the like. The protective layer 600 and the third coupling member AM3 may constitute a protective film.

The mold frames 710 and 750 may be disposed around the display panel 100. The first mold frame 710 may be located on one side of the display panel 100, and the second mold frame 750 may be located on the other side of the display panel 100. The mold frames 710 and 750 may cover the side and upper surfaces of the display panel 100.

Each of the mold frames 710 and 750 may include an electrically conductive material.

The brackets 910 and 950 may be further disposed around the display panel 100. The first bracket 910 may be located on one side of the display panel 100, and a second bracket 950 may be located on the other side of the display panel 100. The brackets 910 and 950 may cover the side and lower surfaces of the display panel 100.

Each of the brackets 910 and 950 may include an electrically conductive material.

In the display device 1, according to an exemplary embodiment of the present disclosure, a cover window might not be disposed between the protective layer 600 and the display panel 100. The cover window may include a rigid material such as glass or quartz.

Thus, when the display device 1 is folded, it is possible to reduce bending stress caused by the rigid material. However, as described above, the protective layer 600 includes an organic insulating material, and the organic insulating material may more slowly discharge static electricity than the cover window.

In addition, as described above, since the planar size of the protective layer 600 is smaller than the planar size of the display panel 100, the upper surface of the display panel 100 may include the cover region CR covered by the protective layer 600, and the exposed region ER exposed by the protective layer 600. The protective layer 600 may be disposed so as not to overlap the mold frames 710 and 750 located on one side and the other side of the display panel 100, respectively. Accordingly, the user can easily remove and reattach the protective layer 600. However, since the protective layer 600 is not disposed on the entire surface of the display panel 100, in terms of a module structure, when static electricity is applied, the ground area may be insufficient to adequately dissipate static electricity.

For example, in terms of the structure and constituent materials of the display device 1, the applied static electricity may be transferred to the display panel 100 where it might not easily be discharged. The static electricity transferred to the display panel 100 may move to both sides of the display panel 100. The static electricity may cause thin film transistors of the plurality of pixels of the display panel 100 to become defective. For example, the static electricity may cause current leakage of the thin film transistor of the display panel 100, resulting in a display failure. The plurality of pixels of the display panel 100 may include a blue pixel which emits blue light, a green pixel which emits green light, and a red pixel which emits red light. A blue organic light emitting layer may be disposed on the blue pixel, a green organic light emitting layer may be disposed on the green pixel, and a red organic light emitting layer may be disposed on the red pixel.

The green organic light emitting layer may have better light emission efficiency than either the blue organic light emitting layer or the red organic light emitting layer. In this case, when current leakage of the thin film transistor occurs, undesired green light is generated in the green organic light emitting layer, and green light non-uniformity may occur on both sides or an edge portion of the display panel 100.

However, the display device 1, according to an exemplary embodiment of the present disclosure, may include the mold frames 710 and 750 and the brackets 910 and 950, each of which includes an electrically conductive material. The mold frames 710 and 750 and the brackets 910 and 950 are electrically connected to each other so that applied static electricity can be discharged from the mold frames 710 and 750 through the brackets 910 and 950.

As described above, the mold frames 710 and 750 may include an electrically conductive material. A first mold frame 710 may include a main frame portion 720 and a frame conductive layer 730 disposed on the surface of the main frame portion 720. A second mold frame 750 may include a main frame portion 760 and a frame conductive layer 770 disposed on the surface of the main frame portion 760. Each of the main frame portions 720 and 760 may include an organic insulating material. Examples of the organic insulating material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof.

For example, the main frame portions 720 and 760 may include polycarbonate (PC).

The frame conductive layers 730 and 770 may be disposed on the surfaces of the main frame portions 720 and 760, respectively. Although it is illustrated in the drawing that the frame conductive layers 730 and 770 are disposed on the surface facing the protective layer 600 of the main frame portions 720 and 760, respectively, the present invention is not limited thereto. The main frame portions 720 and 760 may be disposed on a surface opposite to the surface facing the protective layer 600 of the main frame portions 720 and 760, respectively.

The frame conductive layers 730 and 770 may be formed by coating, depositing, or thermally attaching a conductive material or conductive powder to the surfaces of the main frame portions 720 and 760, respectively, but the formation method is not limited thereto.

The frame conductive layers 730 and 770 may serve to induce static electricity applied to the display device 1 in the mold frames 710 and 750.

As illustrated in FIG. 4, a first main frame portion 720 may include a first portion 721 and a second portion 723 connected to the first portion 721. The first portion 721 may be a sidewall portion of the main frame portion, and the second portion 723 may be a protrusion portion of the main frame portion. The second portion 723 may protrude from the first portion 721 toward the folding region FR.

The first portion 721 may be disposed on the side surface of the display panel 100, and the second portion 723 may at least partially overlap one surface of the display panel 100 in the thickness direction. The second portion 723 may at least partially overlap the first non-folding region NFR1 of the display panel 100.

Similarly to the first main frame portion 720, a second main frame portion 760 may include a first portion, which is a sidewall portion of the main frame portion, and a second portion, that is a protrusion portion of the main frame portion. The configuration of the second main frame portion 760 may be substantially the same as the configuration of the first main frame portion 720.

The first frame conductive layer 730 may be formed on the first portion 721 and the second portion 723 of the first main frame portion 720, respectively. For example, the first frame conductive layer 730 may include a first portion 731 disposed between the first portion 721 of the first main frame portion 720 and the display panel 100, and a second portion 733 disposed between the second portion 723 of the first main frame portion 720 and the display panel 100. The second frame conductive layer 770 may have substantially the same configuration as that of the first frame conductive layer 730.

The first bracket 910 may at least partially overlap the first mold frame 710, and the second bracket 950 may at least partially overlap the second mold frame 750.

Each of the brackets 910 and 950 may include an electrically conductive material.

Examples of the conductive material may include aluminum (Al) or magnesium (Mg). The brackets 910 and 950 may be made of a conductive material, respectively. For example, the brackets 910 and 950 may be conductors made of the conductive material.

The first bracket 910 may be electrically connected to the first mold frame 710, and the second bracket 950 may be electrically connected to the second mold frame 750.

A first connection conductor 810 may be disposed between the first bracket 910 and the first mold frame 710, and a second connection conductor 850 may be disposed between the second bracket 950 and the second mold frame 750.

The first connection conductor 810 may serve to electrically connect the first bracket 910 to the first mold frame 710, and the second connection conductor 850 may serve to electrically connect the second bracket 950 to the second mold frame 750.

For example, as illustrated in FIG. 5, the first connection conductor 810 may include a first conductive bonding layer 812 disposed between a conductive base material 811 and the first main frame portion 720, and a second conductive bonding layer 813 disposed between the conductive base material 811 and the first bracket 910. The first connection conductor 810 may be a double-sided tape.

The second connection conductor 850 may include substantially the same configuration as that of the first connection conductor 810. The second connection conductor 850 may include an electrically conductive base material, a first conductive bonding layer disposed between the conductive base material and the second main frame portion 760, and a second conductive bonding layer disposed between the conductive base material and the second bracket 950. The second connection conductor 850 may be a double-sided tape.

In some exemplary embodiments of the present disclosure, each of the connection conductors 810 and 850 may include a clamp.

The brackets 910 and 950 may be further extended and disposed on the lower surface of the display panel 100, respectively. The brackets 910 and 950 may be combined with the double-sided tapes 410 and 450, respectively. The brackets 910 and 950 may be attached to the second bonding layers 440 and 480 of the double-sided tapes 410 and 450, respectively.

The inner surfaces of portions of the brackets 910 and 950 extended further on the lower surface of the display panel 100 may be aligned with boundaries between the non-folding regions NFR1 and NFR2 and the folding region FR, respectively.

FIG. 6 illustrates the display panel 100 and the mold frames 710 and 750 covering the display panel 100 according to an exemplary embodiment of the present disclosure.

The first mold frame 710 may be disposed adjacent to the first non-folding region NFR1 of the display panel 100, and the second mold frame 750 may be disposed adjacent to the second non-folding region NFR2 of the display panel 100.

The first mold frame 710 and the second mold frame 750 may respectively cover short sides and long sides of the display panel 100. However, the first mold frame 710 and the second mold frame 750 may be omitted from the folding region FR. Accordingly, when the display device 1 is folded, bending stress can be prevented from occurring due to the mold frame disposed in the folding region FR.

However, in some embodiments, the mold frame may also be disposed in the folding region FR. For example, the first mold frame 710 and the second mold frame 750 may be physically connected. The width of the mold frame disposed in the folding region FR in the second direction DR2 may be smaller than the width of the first mold frame 710 and the second mold frame 750 in the second direction DR2, respectively. In this case, it is possible to reduce the occurrence of large bending stress due to the mold frame disposed in the folding region FR when the display device 1 is folded.

The first portion 731 of the first frame conductive layer 730 may be disposed around the short sides and long sides of the display panel 100. The first portion 731 of the first frame conductive layer 730 may be disposed so as not to overlap the display panel 100. The first portion 731 of the first frame conductive layer 730 may be continuously disposed along the short sides and long sides of the display panel 100. The first portion of the second frame conductive layer 770 may have substantially the same shape as the first portion 731 of the first frame conductive layer 730.

The second portion 733 of the first frame conductive layer 730 may be connected to the first portion 731 of the first frame conductive layer 730. The second portion 733 of the first frame conductive layer 730 may extend from the first portion 731 of the first frame conductive layer 730 and may at least partially overlap the display panel 100 in the thickness direction. The second portion 733 of the first frame conductive layer 730 may be continuously disposed along the first portion 731 of the first frame conductive layer 730 disposed continuously. For example, the first portion 731 of the first frame conductive layer 730 may be continuously disposed along the first portion 721 of the first main frame portion 720, and the second portion 733 of the first frame conductive layer 730 may be continuously disposed along the second portion 723 of the first main frame portion 720.

The second portion of the second frame conductive layer 770 may have substantially the same shape as the first portion 731 of the first frame conductive layer 730.

Referring to FIG. 7, static electricity ESD applied to the display device 1 from the outside may be conducted to the mold frames 710 and 750 including a conductive material.

The static electricity ESD provided to the mold frames 710 and 750 may be moved to the connection conductors 810 and 850 electrically connected to the mold frames 710 and 750 and moved to the brackets 910 and 950 electrically connected to the connection conductors 810 and 850. The brackets 910 and 950 may be connected to a set ground which may serve as a ground such that static electricity ESD conducted to the brackets 910 and 950 can be discharged to the outside.

As described above, since the planar size of the protective layer 600 is smaller than the planar size of the display panel 100, the upper surface of the display panel 100 may include the cover region CR covered by the protective layer 600, and the exposed region ER exposed by the protective layer 600. The protective layer 600 may be disposed so as not to overlap the mold frames 710 and 750 located on one side and the other side of the display panel 100, respectively.

Accordingly, the user can easily remove and reattach the protective layer 600. However, since the protective layer 600 is not disposed on the entire surface of the display panel 100, in terms of a module structure, when static electricity is applied, the ground area may be insufficient to adequately discharge the static electricity.

For example, in terms of the structure and constituent materials of the display device 1, the applied static electricity may be transferred to the display panel 100 where it might not easily be discharged. Static electricity transferred to the display panel 100 may move to both sides of the display panel 100. The static electricity may cause thin film transistors of the plurality of pixels of the display panel 100 to become defective. For example, the static electricity may cause current leakage of the thin film transistor of the display panel 100, resulting in a display failure. The plurality of pixels of the display panel 100 may include a blue pixel which emits blue light, a green pixel which emits green light, and a red pixel which emits red light. A blue organic light emitting layer may be disposed on the blue pixel, a green organic light emitting layer may be disposed on the green pixel, and a red organic light emitting layer may be disposed on the red pixel.

The green organic light emitting layer may have better light emission efficiency than the blue organic light emitting layer and the red organic light emitting layer. In this case, when current leakage of the thin film transistor occurs, undesired green light is generated in the green organic light emitting layer, and green non-uniformity may occur on both sides or an edge portion of the display panel 100.

However, in the display device 1, according to an exemplary embodiment of the present disclosure, the mold frames 710 and 750 and the brackets 910 and 950 covering the display panel 100 include an electrically conductive material, and are electrically connected to each other. Accordingly, an escape path from the mold frames 710 and 750 of the static electricity ESD applied to the display device 1 from the outside to the brackets 910 and 950 can be established.

Thus, it is possible to prevent a display failure such as green non-uniformity from occurring on both sides or an edge portion of the display panel 100 due to defects in the thin film transistors of the plurality of pixels of the display panel 100 generated due to static electricity applied to the display device 1.

Hereinafter, exemplary embodiments of the present disclosure will be described. In the following embodiments, the same components as those of the above-described embodiment are denoted by the same reference numerals, and a description thereof will be omitted or simplified.

Figure 8:
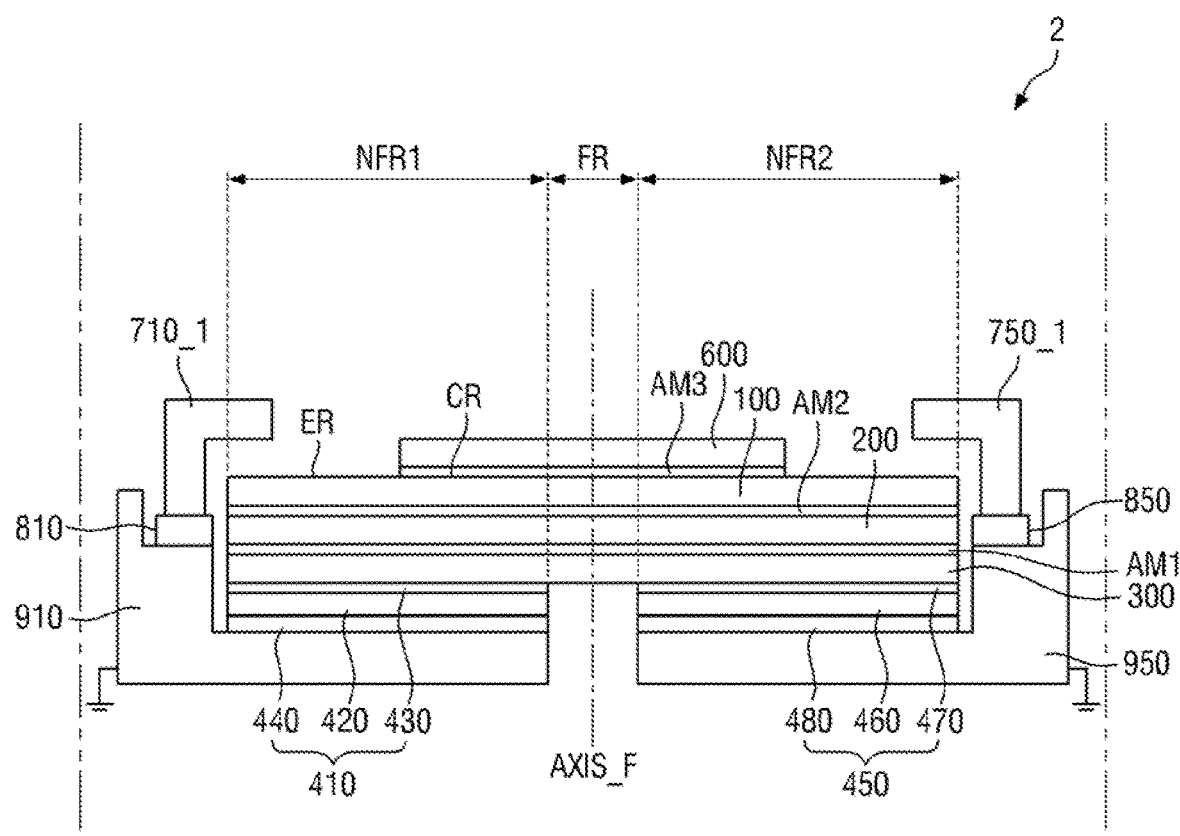
FIG. 8 is a cross-sectional view illustrating a display device according to an exemplary embodiment of the present disclosure.
Figure 9:
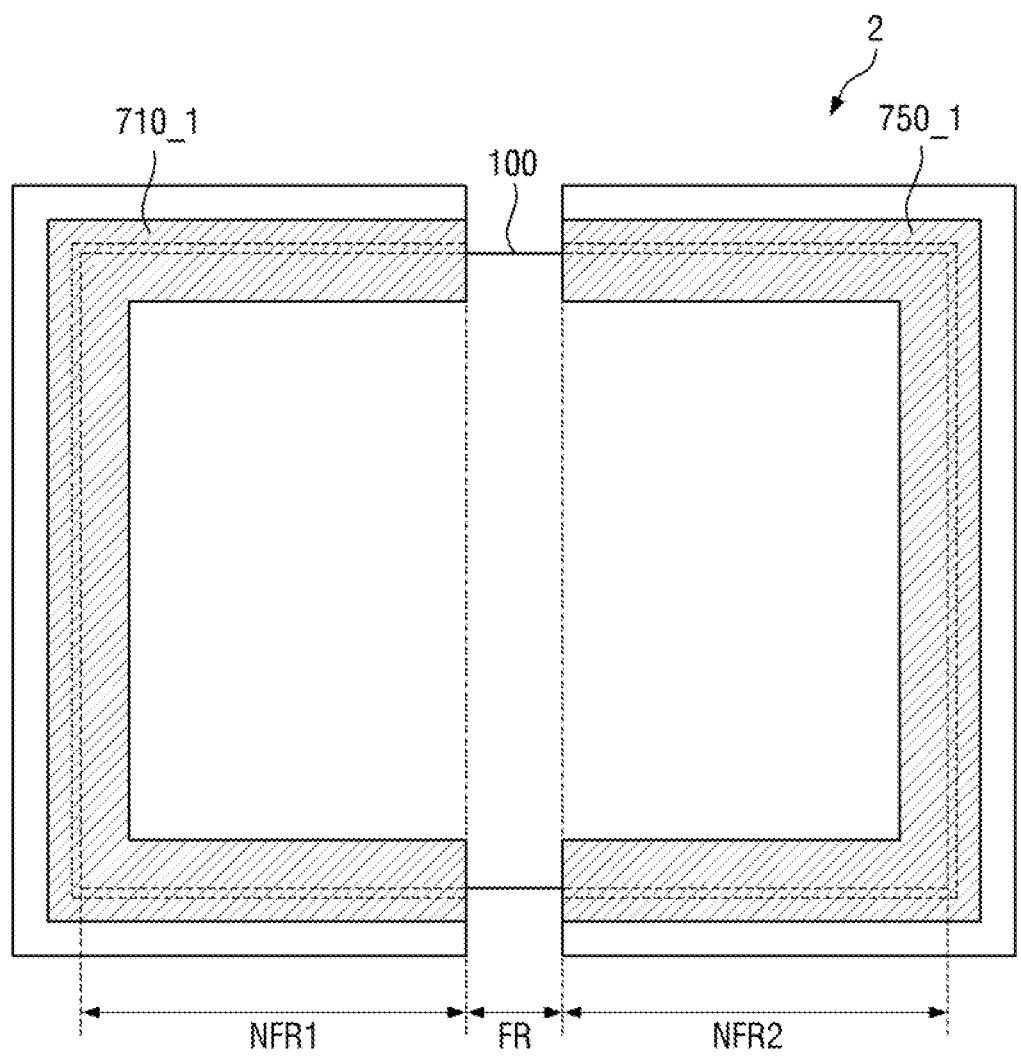
FIG. 9 is a plan layout view illustrating a display panel, a first mold frame and a second mold frame according to an exemplary embodiment of the present disclosure.

FIG. 8 is a cross-sectional view illustrating a display device according to an exemplary embodiment of the present disclosure. FIG. 9 is a plan layout view of a display panel, a first mold frame and a second mold frame according to an exemplary embodiment of the present disclosure.

Referring to FIGS. 8 and 9, a display device 2, according to the present embodiment differs from the display device 1 of FIG. 3 in that the display devices 2 includes mold frames 710_1 and 750_1.

For example, the display device 2 according to the present embodiment may include the mold frames 710_1 and 750_1.

The mold frames 710_1 and 750_1 may be disposed with electrically conductive metal powder dispersed in the mold frame.

The mold frames 710_1 and 750_1 according to the present embodiment may be formed by alternately mixing the electrically conductive metal powder with the organic insulating material illustrated in FIG. 3.

Also in the present embodiment, since the planar size of the protective layer 600 is smaller than the planar size of the display panel 100, the upper surface of the display panel 100 may include the cover region CR covered by the protective layer 600, and the exposed region ER exposed by the protective layer 600. The protective layer 600 may be disposed so as not to overlap the mold frames 710_1 and 750_1 located on one side and the other side of the display panel 100, respectively. Accordingly, the user can easily remove and reattach the protective layer 600. However, since the protective layer 600 is not disposed on the entire surface of the display panel 100, in terms of a module structure, when static electricity is applied, the ground area may be insufficient to adequately discharge the static electricity.

For example, in terms of the structure and constituent materials of the display device 2, the applied static electricity may be transferred to the display panel 100 where it might not easily be discharged. Static electricity transferred to the display panel 100 may move to both sides of the display panel 100. The static electricity may cause the thin film transistors of the plurality of pixels of the display panel 100 to become defective. For example, the static electricity may cause current leakage of the thin film transistor of the display panel 100, resulting in a display failure. The plurality of pixels of the display panel 100 may include a blue pixel which emits blue light, a green pixel which emits green light, and a red pixel which emits red light. A blue organic light emitting layer may be disposed on the blue pixel, a green organic light emitting layer may be disposed on the green pixel, and a red organic light emitting layer may be disposed on the red pixel.

The green organic light emitting layer may have better light emission efficiency than the blue organic light emitting layer and the red organic light emitting layer. In this case, when current leakage of the thin film transistor occurs, undesired green light is generated in the green organic light emitting layer, and green non-uniformity may occur on both sides or an edge portion of the display panel 100.

However, in the display device 1 according to the present embodiment, the mold frames 710_1 and 750_1 and the brackets 910 and 950 covering the display panel 100 include an electrically conductive material, and are electrically connected to each other. Accordingly, an escape path from the mold frames 710_1 and 750_1 of the static electricity ESD applied to the display device 1 from the outside to the brackets 910 and 950 can be secured.

Thus, it is possible to prevent a display failure such as green non-uniformity from occurring on both sides or an edge portion of the display panel 100 due to defects in the thin film transistors of the plurality of pixels of the display panel 100 generated due to the remaining of static electricity applied to the display device 2.

Figure 10:
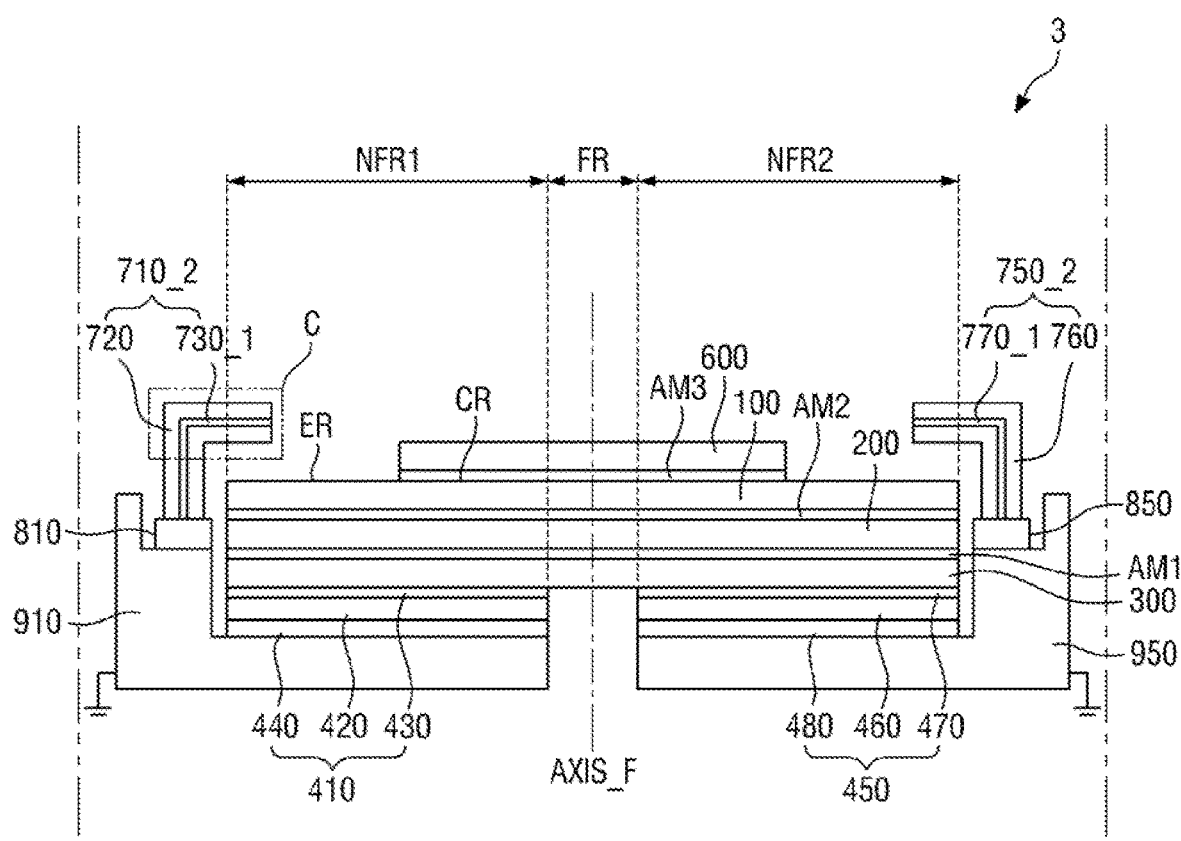
FIG. 10 is a cross-sectional view illustrating a display device according to an exemplary embodiment of the present disclosure.
Figure 11:
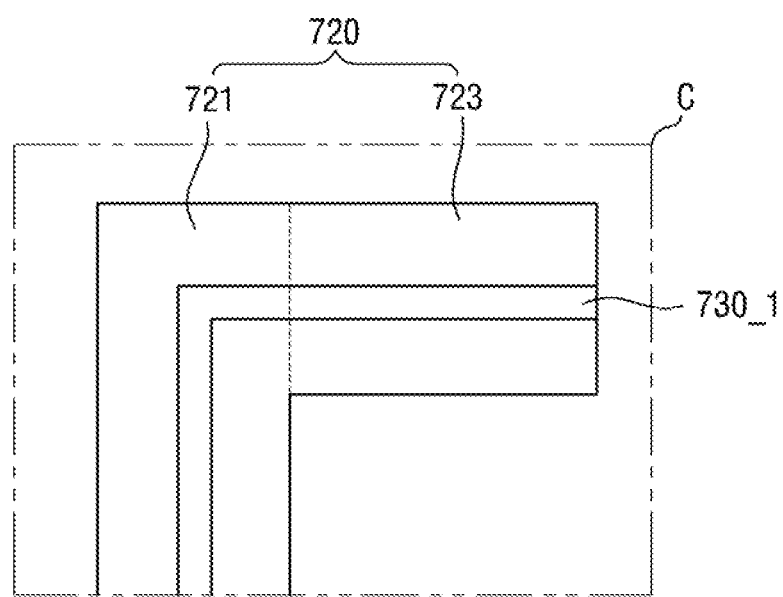
FIG. 11 is an enlarged cross-sectional view of region C of FIG. 10.

FIG. 10 is a cross-sectional view illustrating a display device according to an exemplary embodiment of the present disclosure. FIG. 11 is an enlarged cross-sectional view of region C of FIG. 10.

Referring to FIGS. 10 and 11, a display device 3 according to the present embodiment differs from the display device 1 of FIGS. 3 and 4 in that frame conductive layers 730_1 and 770_1 are disposed inside the main frame portions 720 and 760.

For example, in the display device 3 according to the present embodiment, the frame conductive layers 730_1 and 770_1 may be disposed inside the main frame portions 720 and 760. The frame conductive layers 730_1 and 770_1 may be formed to be inserted into the main frame portions 720 and 760.

The first frame conductive layer 730_1 may pass through the first portion 721 and the second portion 723 of the first main frame portion 720.

Also in the present embodiment, since the planar size of the protective layer 600 is smaller than the planar size of the display panel 100, the upper surface of the display panel 100 may include the cover region CR covered by the protective layer 600, and the exposed region ER exposed by the protective layer 600. The protective layer 600 may be disposed so as not to overlap the mold frames 710_2 and 750_2 located on one side and the other side of the display panel 100, respectively. Accordingly, the user can easily remove and reattach the protective layer 600. However, since the protective layer 600 is not disposed on the entire surface of the display panel 100, in terms of a module structure, when static electricity is applied, the ground area may be insufficient to adequately discharge the static electricity.

For example, in terms of the structure and constituent materials of the display device 3, the applied static electricity may be transferred to the display panel 100 where it might not easily be discharged. Static electricity transferred to the display panel 100 may move to both sides of the display panel 100. The static electricity may cause the thin film transistors of the plurality of pixels of the display panel 100 to become defective. For example, the static electricity may cause current leakage of the thin film transistor of the display panel 100, resulting in a display failure. The plurality of pixels of the display panel 100 may include a blue pixel which emits blue light, a green pixel which emits green light, and a red pixel which emits red light. A blue organic light emitting layer may be disposed on the blue pixel, a green organic light emitting layer may be disposed on the green pixel, and a red organic light emitting layer may be disposed on the red pixel.

The green organic light emitting layer may have better light emission efficiency than the blue organic light emitting layer and the red organic light emitting layer. In this case, when current leakage of the thin film transistor occurs, undesired green light is generated in the green organic light emitting layer, and green non-uniformity may occur on both sides or an edge portion of the display panel 100.

However, in the display device 3 according to the present embodiment, the mold frames 7102 and 750_2 and the brackets 910 and 950 covering the display panel 100 include an electrically conductive material, and are electrically connected to each other. Accordingly, an escape path from the mold frames 710_2 and 750_2 of the static electricity ESD applied to the display device 3 from the outside to the brackets 910 and 950 can be secured.

Thus, it is possible to prevent a display failure such as green non-uniformity from occurring on both sides or an edge portion of the display panel 100 due to defects in the thin film transistors of the plurality of pixels of the display panel 100 generated due to the remaining of static electricity applied to the display device 3.

Figure 12:
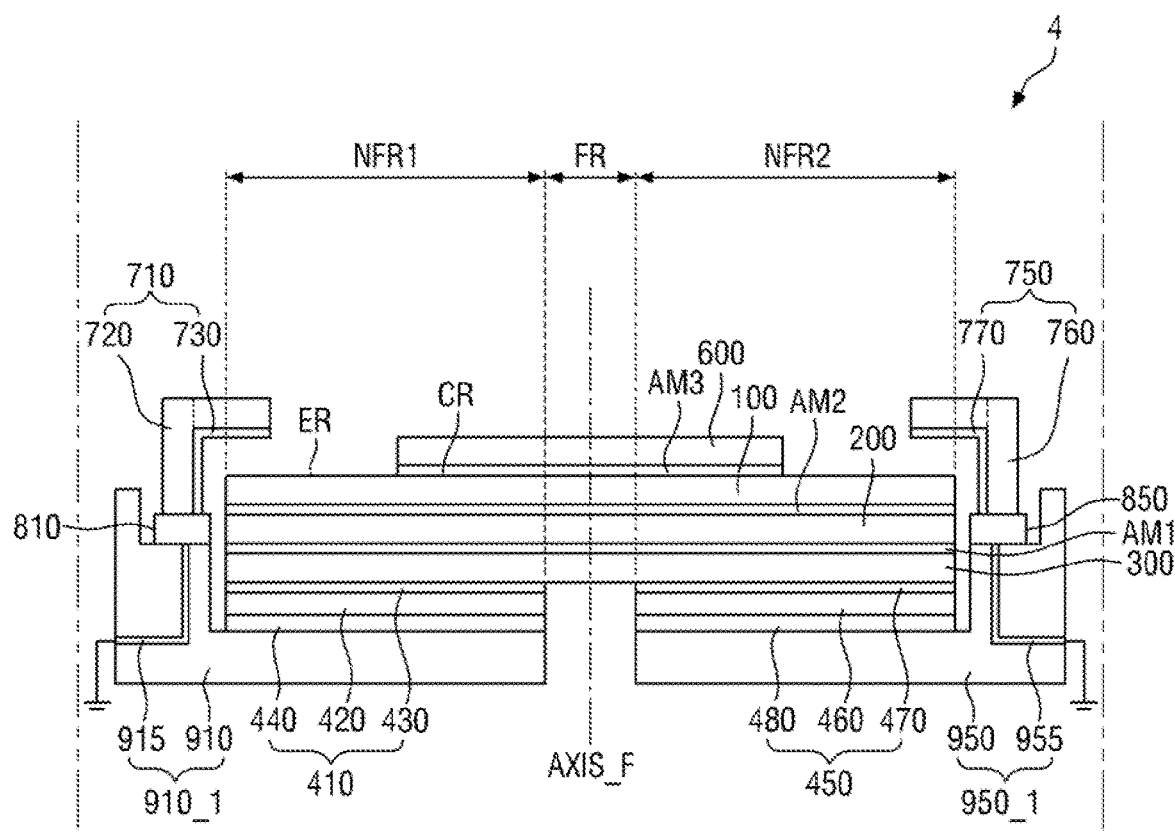
FIG. 12 is a cross-sectional view illustrating a display device according to an exemplary embodiment of the present disclosure.

FIG. 12 is a cross-sectional view of a display device according to an exemplary embodiment of the present disclosure.

Referring to FIG. 12, a display device 4, according to the present embodiment differs from the display device 1 of FIG. 3 in that brackets 910_1 and 950_1 include the main bracket portions 910 and 950, and bracket conductive layers 915 and 955 disposed inside the main bracket portions 910_1 and 950_1.

For example, in the display device 4, according to the present embodiment, the brackets 9101 and 9501 may include the main bracket portions 910 and 950, and the bracket conductive layers 915 and 955 disposed inside the main bracket portions 910 and 950.

Unlike the brackets 910 and 950 of FIG. 3, the main bracket portions 910 and 950 may include an organic insulating material.

The bracket conductive layers 915 and 955 and the frame conductive layers 730 and 770 may be electrically connected through the connection conductors 810 and 850, respectively.

The bracket conductive layers 915 and 955 may be exposed on the outer surfaces of the main bracket portions 910 and 950, respectively.

Also in the present embodiment, since the planar size of the protective layer 600 is smaller than the planar size of the display panel 100, the upper surface of the display panel 100 may include the cover region CR covered by the protective layer 600, and the exposed region ER exposed by the protective layer 600. The protective layer 600 may be disposed so as not to overlap the mold frames 7102 and 750_2 located on one side and the other side of the display panel 100, respectively. Accordingly, the user can easily remove and reattach the protective layer 600. However, since the protective layer 600 is not disposed on the entire surface of the display panel 100, in terms of a module structure, when static electricity is applied, the ground area may be insufficient to adequately discharge the static electricity.

For example, in terms of the structure and constituent materials of the display device 4, the applied static electricity may be transferred to the display panel 100 where it might not easily be discharged. Static electricity transferred to the display panel 100 may move to both sides of the display panel 100. The static electricity may cause the thin film transistors of the plurality of pixels of the display panel 100 to become defective. For example, the static electricity may cause current leakage of the thin film transistor of the display panel 100, resulting in a display failure. The plurality of pixels of the display panel 100 may include a blue pixel which emits blue light, a green pixel which emits green light, and a red pixel which emits red light A blue organic light emitting layer may be disposed on the blue pixel, a green organic light emitting layer may be disposed on the green pixel, and a red organic light emitting layer may be disposed on the red pixel.

The green organic light emitting layer may have better light emission efficiency than the blue organic light emitting layer and the red organic light emitting layer. In this case, when current leakage of the thin film transistor occurs, undesired green light is generated in the green organic light emitting layer, and green non-uniformity may occur on both sides or an edge portion of the display panel 100.

However, in the display device 4, according to the present embodiment, the mold frames 710 and 750 and the brackets 910_1 and 950_1 covering the display panel 100 include an electrically conductive material, and are electrically connected to each other. Accordingly, an escape path from the mold frames 710 and 750 of the static electricity ESD applied to the display device 4 from the outside to the brackets 910_1 and 950_1 can be secured.

Thus, it is possible to prevent a display failure such as green non-uniformity from occurring on both sides or an edge portion of the display panel 100 due to defects in the thin film transistors of the plurality of pixels of the display panel 100 generated due to the remaining of static electricity applied to the display device 4.

Figure 13:
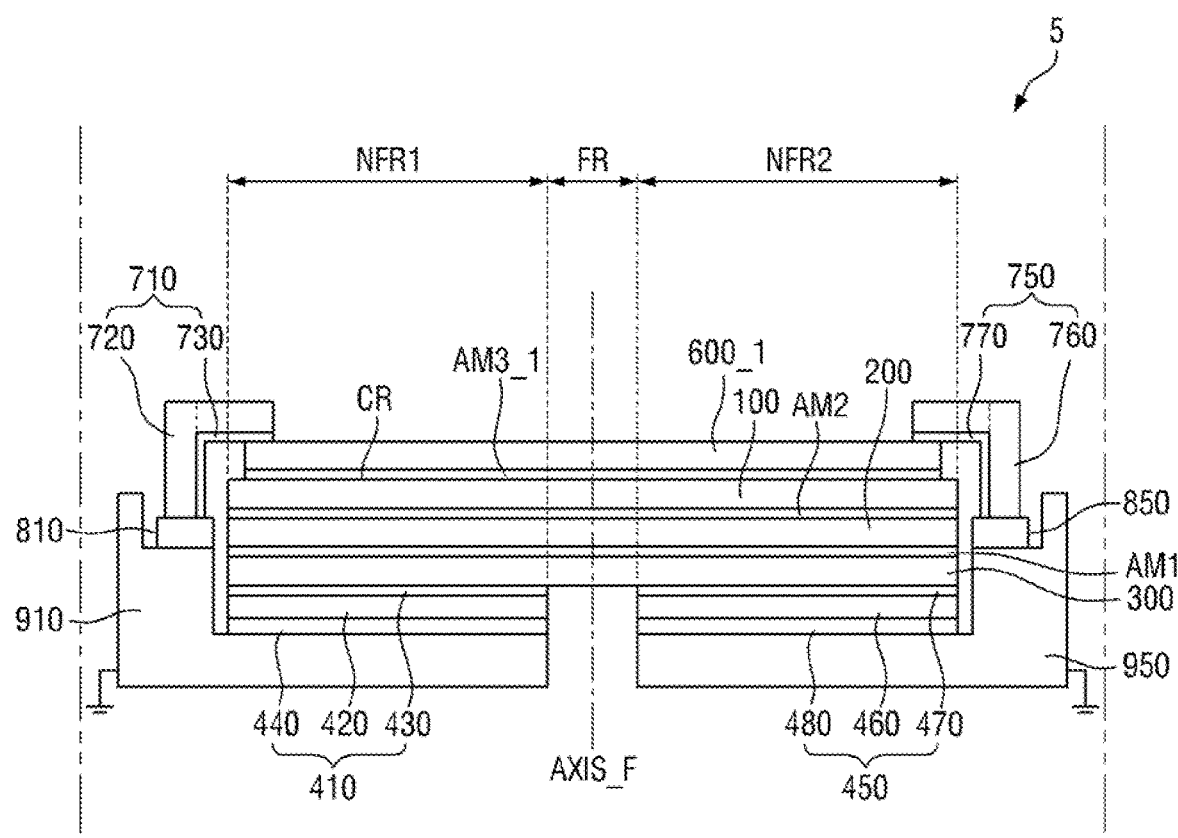
FIG. 13 is a cross-sectional view of a display device according to an exemplary embodiment of the present disclosure.

FIG. 13 is a cross-sectional view of a display device according to an exemplary embodiment of the present disclosure.

Referring to FIG. 13, a display device 5, according to the present embodiment differs from the display device 1 of FIG. 3 in that a protective layer 600_1 further extends outward to overlap the mold frames 710 and 750.

For example, in the display device 5, according to the present embodiment, a protective layer 600_1 may further extend outward to at least partially overlap the mold frames 710 and 750. The protective layer 600_1, according to the present embodiment, may further extend outward to overlap the mold frames 710 and 750 to further increase the ground area by the protective layer 600_1.

Similarly to the protective layer 600_1, a third coupling member AM3_1 may further extend outward.

Figure 14:
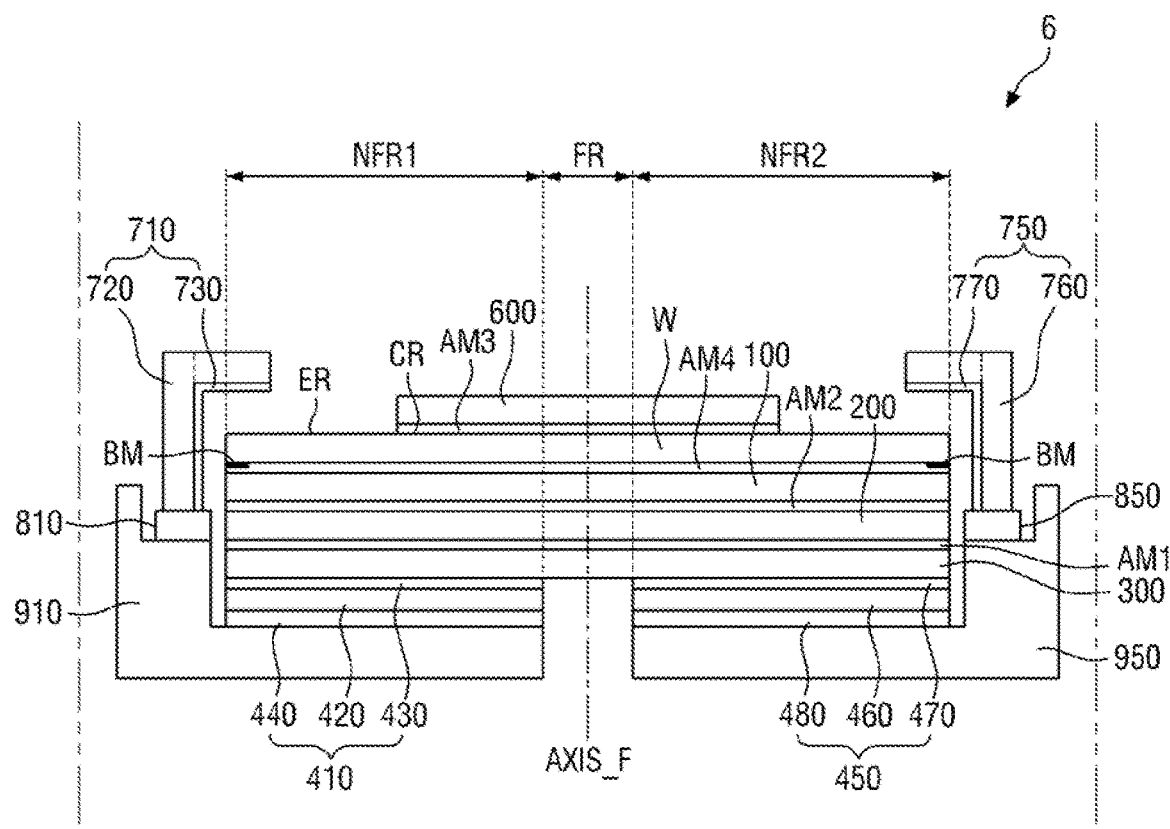
FIG. 14 is a cross-sectional view illustrating a display device according to an exemplary embodiment of the present disclosure.
Figure 15:
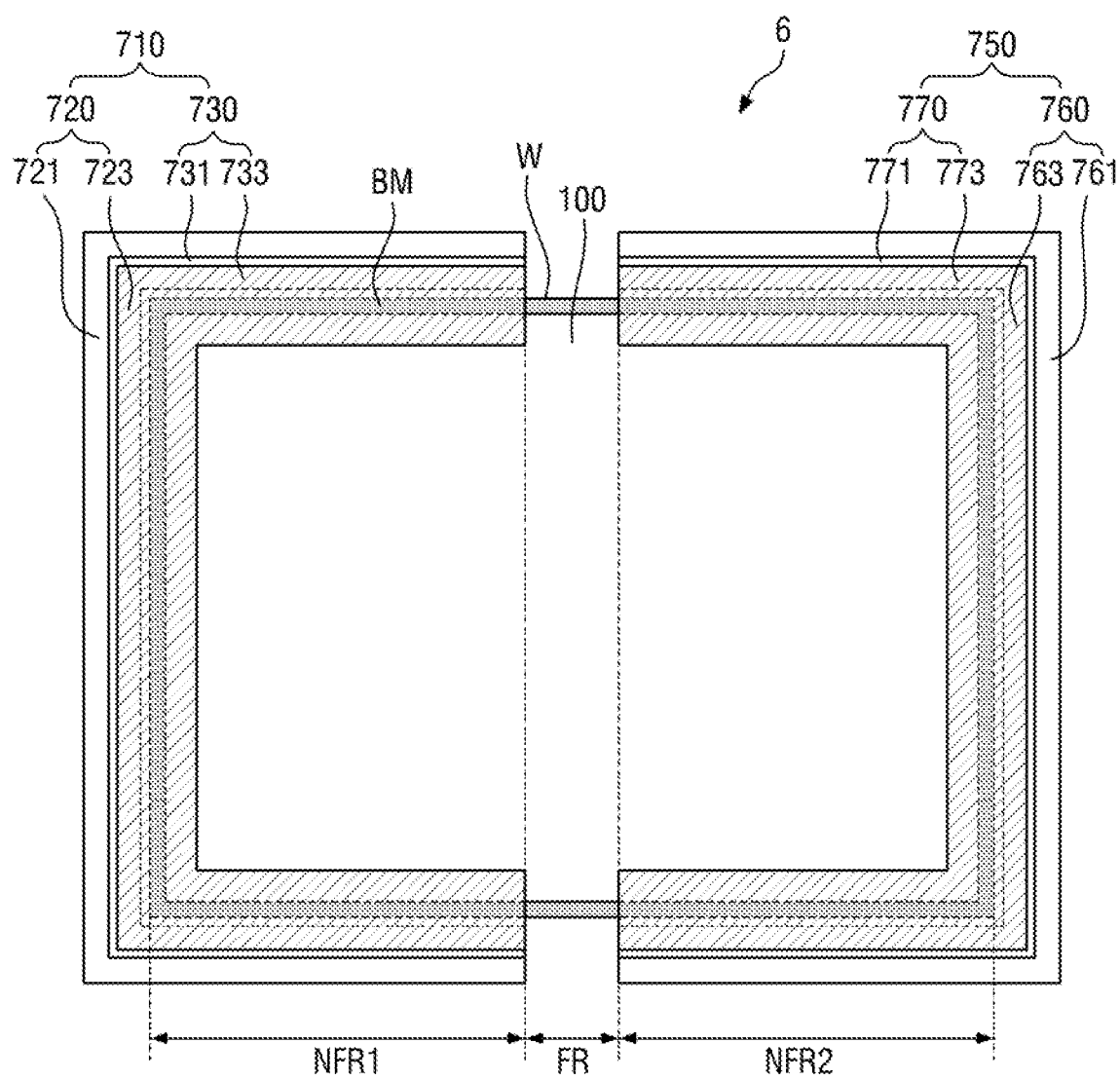
FIG. 15 is a plan layout view illustrating a display panel, a cover window, a light blocking pattern, a first mold frame and a second mold frame according to an exemplary embodiment of the present disclosure.

FIG. 14 is a cross-sectional view of a display device according to an exemplary embodiment of the present disclosure. FIG. 15 is a plan layout view of a display panel, a cover window, a light blocking pattern, a first mold frame and a second mold frame according to an exemplary embodiment of the present disclosure.

Referring to FIGS. 14 and 15, a display device 6, according to the present embodiment differs from the display device 1 of FIG. 3 in that it further includes a window W disposed between the protective layer 600 and the display panel 100.

For example, the display device 6 according to the present embodiment may further include a window W disposed between the protective layer 600 and the display panel 100. For example, the window W may be disposed between the third coupling member AM3 and the display panel 100. The window W may be attached to the display panel 100 through the fourth coupling member AM4. The fourth coupling member AM4 may include the same material as the third coupling member AM3.

The window W covers and protects the members disposed below. The window W may be made of glass, quartz, or the like. When the window W is relatively thin, the stress may become small during folding, and even if the display device 6 is repeatedly folded and unfolded, the degree of deformation of the structure may be small. The window W may include ultra thin glass (UTG).

The planar shape of the window W may be substantially the same as the planar shape of the display panel 100. Although FIG. 15 illustrates that the planar size of the window W is the same as the planar size of the display panel 100, the planar size of the window W is not limited thereto and may be larger than the planar size of the display panel 100.

A light blocking pattern BM may be disposed on the lower surface of the window W.

As illustrated in FIG. 15, the light blocking pattern BM may be continuously disposed along the edge of the window W.

The light blocking pattern BM, according to the present embodiment, may include an electrically conductive material.

Accordingly, the static electricity applied from the outside to the display device 6 is applied to the light blocking pattern BM including the conductive material, and the static electricity applied to the light blocking pattern BM might not be moved to the display panel 100 but may be moved to the adjacent mold frames 710 and 750 including a conductive material.

Figure 16:
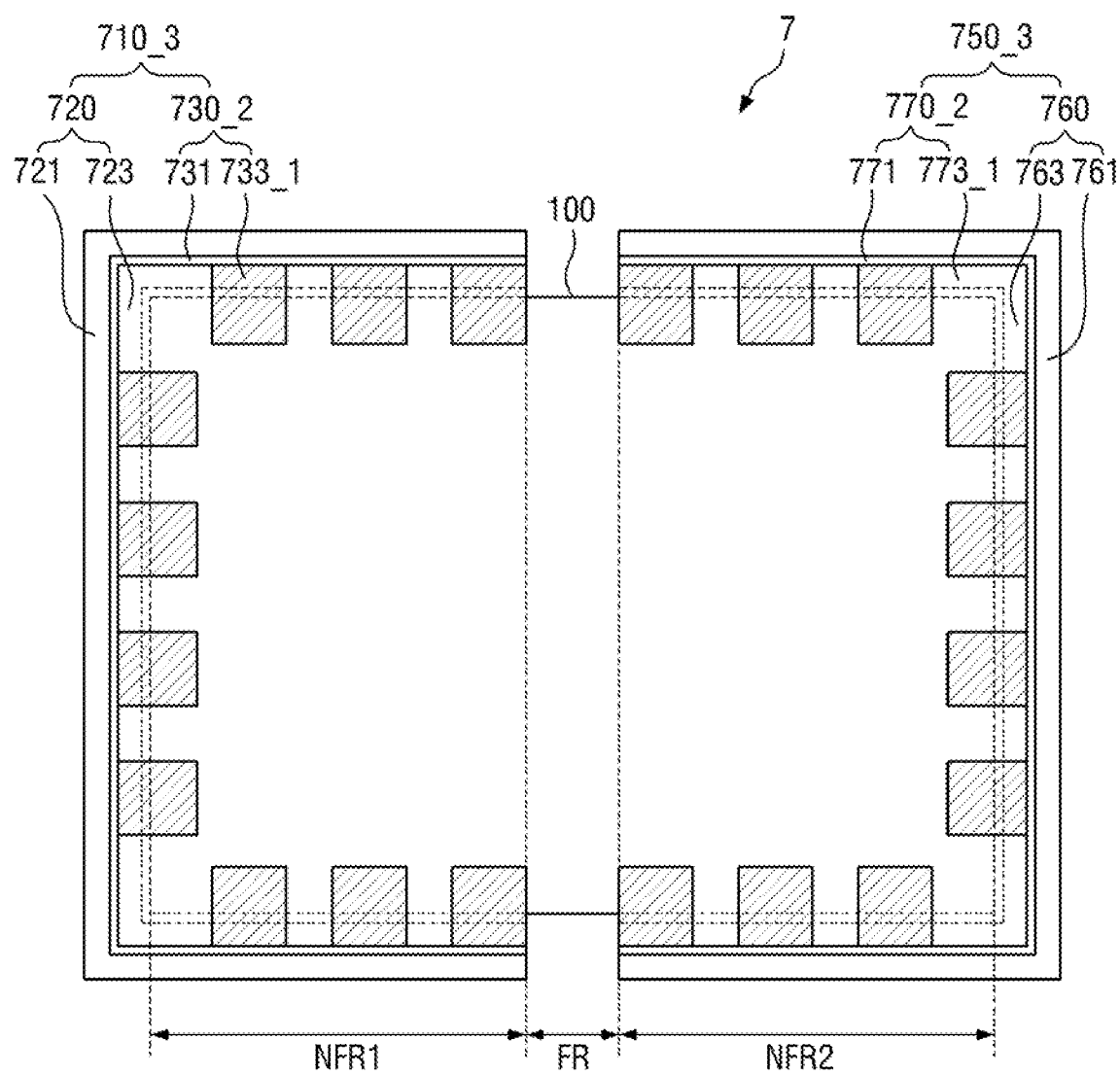
FIG. 16 is a plan layout view illustrating a display panel, a first mold frame and a second mold frame according to an exemplary embodiment of the present disclosure.

FIG. 16 is a plan layout view illustrating a display panel, a first mold frame and a second mold frame according to an exemplary embodiment of the present disclosure.

Referring to FIG. 16, a display device 7, according to the present embodiment differs from the display device 1 of FIG. 6 in that it includes mold frames 710_3 and 750_3.

For example, second portions 733_1 and 773_1 of frame conductive layers 7302 and 770_2 of the mold frames 710_3 and 7503, according to the present embodiment, might not be continuously disposed along the first portions 731 and 771, but may be spaced apart from each other along the first portions 731 and 771.

Those skilled in the art will appreciate that many variations and modifications can be made to the described embodiments without substantially departing from the principles of the present disclosure.

What is claimed is:

1. A display device, comprising:
a display panel;
a mold frame at least partially surrounding the display panel; and
a bracket at least partially overlapping the mold frame,
wherein each of the mold frame and the bracket includes an electrically conductive material, and
wherein the mold frame and the bracket are electrically connected to each other.

2. The display device of claim 1, further comprising a protective film disposed on the display panel,
wherein the display panel includes a cover region at least partially overlapping the protective film and an exposed region exposed by the protective film.

3. The display device of claim 2, wherein the protective film includes a protective base, and a protective base bonding layer disposed between the protective base and the display panel.

4. The display device of claim 2, further comprising a connection conductor disposed between the bracket and the mold frame,
wherein each of the mold frame and the bracket are directly connected to the connection conductor.

5. The display device of claim 4, wherein the connection conductor includes a conductive base, a first conductive bonding layer disposed between the conductive base and the mold frame, and a second conductive bonding layer disposed between the bracket and the conductive base.

6. The display device of claim 4, wherein the connection conductor includes a clamp.

7. The display device of claim 4, wherein the mold frame includes a main frame portion and a frame conductive layer disposed directly on a surface of the main frame portion, and
wherein the conductive layer is electrically connected to the bracket.

8. The display device of claim 7, wherein the conductive layer is formed on the main frame portion by coating, deposition, or thermal attachment.

9. The display device of claim 7, wherein the bracket includes an electrically conductive material.

10. The display device of claim 7, wherein the bracket includes a main bracket portion and a bracket conductive layer disposed inside of the main bracket portion, and
wherein the connection conductor is connected to the frame conductive layer and the bracket conductive layer.

11. The display device of claim 10, wherein the main bracket portion is further disposed on a lower surface of the display panel.

12. The display device of claim 7, wherein the main frame portion includes a first frame portion disposed on a side surface of the display panel, and a second frame portion connected to the first frame portion and disposed on the surface of the display panel.

13. The display device of claim 12, wherein the conductive layer is disposed directly on the first frame portion.

14. The display device of claim 13, wherein the conductive layer further includes a plurality of conductive patterns spaced apart from each other along the second frame portion.

15. The display device of claim 4, wherein the mold frame includes an electrically conductive material dispersed therein.

16. The display device of claim 4, wherein the bracket is electrically connected to a set ground wire.

17. The display device of claim 2, further comprising a cover window disposed between the protective film and the display panel, and a light blocking pattern disposed directly on an edge of the cover window,
wherein the light blocking pattern includes an electrically conductive material.

18. A display device, comprising:
a display panel in which a folding region, a first non-folding region located on one side of the folding region, and a second non-folding region located on the other side of the folding region are defined;
a first mold frame disposed adjacent to the first non-folding region of the display panel;
a second mold frame disposed adjacent to the second non-folding region of the display panel;
a first bracket at least partially overlapping the first mold frame; and
a second bracket at least partially overlapping the second mold frame,
wherein each of the first mold frame and the second mold frame includes a first electrically conductive material,
wherein each of the first bracket and the second bracket includes a second electrically conductive material that is either different from or the same as the first electrically conductive material,
wherein the first mold frame and the first bracket are electrically connected to each other, and
wherein the second mold frame and the second bracket are electrically connected to each other.

19. The display device of claim 18, further comprising a protective film disposed on the display panel,
wherein the display panel includes a cover region at least partially overlapping the protective film and an exposed region exposed by the protective film.

20. The display device of claim 19, further comprising a first connection conductor disposed between the first bracket and the first mold frame, and a second connection conductor disposed between the second bracket and the second mold frame,
wherein the first mold frame and the first bracket are directly connected to the first connection conductor, and
wherein the second mold frame and the second bracket are each directly connected to the second connection conductor.

21. The display device of claim 20, wherein each of the first bracket and the second bracket is electrically connected to a set ground wire.

\* \* \* \* \*